United States Patent [19]

Sato et al.

[11] 4,412,906
[45] Nov. 1, 1983

[54] SPUTTERING APPARATUS

[75] Inventors: Yasuhiko Sato; Takamasa Sakai; Shoichi Minagawa, all of Tokyo, Japan

[73] Assignee: Clarion Co., Ltd., Tokyo, Japan

[21] Appl. No.: 332,996

[22] Filed: Dec. 21, 1981

[30] Foreign Application Priority Data

Dec. 27, 1980 [JP] Japan ................................ 55-185709

[51] Int. Cl.³ .............................................. C23C 15/00
[52] U.S. Cl. ................................. 204/298; 204/192 R
[58] Field of Search ................ 204/192 R, 192 P, 298

[56] References Cited

U.S. PATENT DOCUMENTS

| 3,976,555 | 8/1976 | Von Hartel | 204/192 R |
| 4,094,764 | 6/1978 | Boucher et al. | 204/298 |
| 4,128,466 | 12/1978 | Harding et al. | 204/192 C |
| 4,132,624 | 1/1979 | King et al. | 204/298 |
| 4,204,942 | 5/1980 | Chahroudi | 204/298 |

FOREIGN PATENT DOCUMENTS

| 146757 | 3/1981 | German Democratic Rep. | 204/192 R |
| 150480 | 9/1981 | German Democratic Rep. | 204/298 |
| 55-108725 | 8/1980 | Japan | 204/192 R |

Primary Examiner—Aaron Weisstuch
Attorney, Agent, or Firm—Flynn, Thiel, Boutell & Tanis

[57] ABSTRACT

A sputtering apparatus includes a target and a substrate holder respectively supported in a lower portion and an upper portion of a vacuum chamber, a gas jet opening located near the upper surface of the target, and gas withdrawal conduits located near the substrate holder, so that by supplying a gas to the vacuum chamber through the gas jet opening, the gas pressure in the chamber gradually decreases from the region near the target to the region near the substrate holder.

3 Claims, 6 Drawing Figures

SPUTTERING APPARATUS

BACKGROUND OF THE INVENTION

1. Field of the Invention

This invention relates to a sputtering apparatus, and more particularly to such an apparatus which is capable of effectively sputtering by allowing gas pressure to differ from place to place within a vacuum chamber.

2. Description of the Prior Art

Generally in a sputtering apparatus, a target and a substrate to be sputtered are placed in a vacuum chamber containing a gas and a high frequency voltage or a direct current voltage is applied between the target and the substrate to produce a glow discharge and accordingly ionize the gas. Then, the ions impact the target to thereby eject atoms from the target material and allow them to be deposited on the surface of the substrate. Particularly in the process of manufacturing various semiconductor devices, a reactive sputtering technique is used where a reactive gas such as $O_2$, $N_2$, etc. is used as the gas of the vacuum chamber so that reaction with the atoms sputtered from the target occurs to produce a layer comprising an oxide, a nitride or the like covering the substrate.

Conventional sputtering apparatuses have been arranged so that the pressure of the gas within the vacuum chamber is substantially uniform. None have been specifically designed so that the gas pressure varies from place to place within the vacuum chamber. The gas pressure affects the sputtering as follows. When the gas pressure is relatively high, the sputtering process becomes active, and a relatively high gas pressure is required in case of reactive sputtering. On the other hand, when the gas pressure is relatively low, the crystallizability and the layer forming efficiency are improved because the amount of resputtering is low.

Such conventional sputtering apparatuses have realized one or the other of the merits described in the above-mentioned cases of high and low pressure, but have not been able to provide all of the merits obtained in both cases.

OBJECT OF THE INVENTION

It is therefore an object of the present invention, in order to avoid the above-mentioned drawback, to provide a sputtering apparatus so arranged that gas pressure within the vacuum chamber gradually varies in one direction of the vacuum chamber, thus facilitating effective sputtering.

SUMMARY OF THE INVENTION

In accordance with the present invention, there is provided a sputtering apparatus which includes:
a vacuum chamber;
a substrate holding means provided within the vacuum chamber for holding a substrate to be coated;
a target supporting means for supporting a target in opposition to the substrate within the vacuum chamber;
a gas discharge means disposed adjacent the substrate holding means; and
a gas supply means for supplying the vacuum chamber with a gas in such a manner that the gas pressure gradually decreases from the target toward the substrate.

DETAILED DESCRIPTION OF THE PREFERRED EMBODIMENTS

Figure 1:
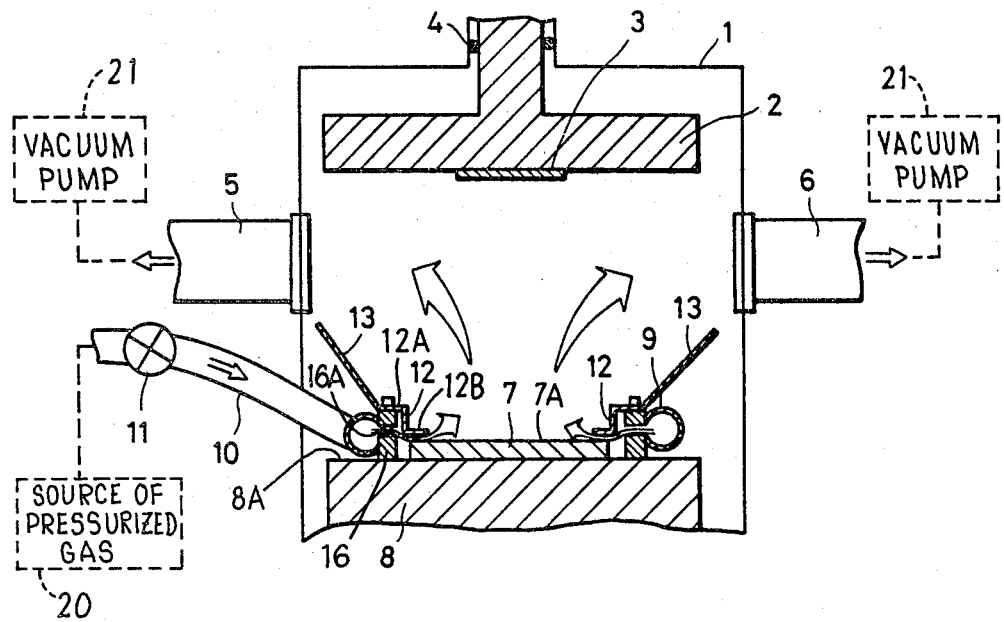
FIG. 1(a) and FIG. 1(b) are a sectional side view and a partial plan view, respectively, of a sputtering apparatus embodying the present invention.
Figure 1:
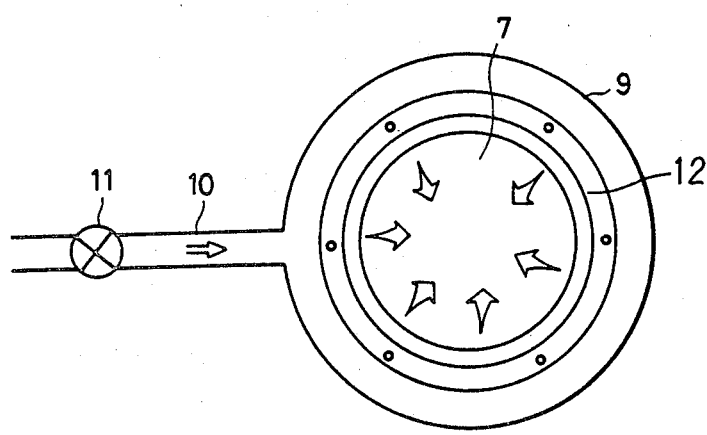

The present invention will now be described in detail, referring to the preferred embodiments illustrated in the drawings.

FIG. 1(a) and FIG. 1(b) show a sectional side view and a partial plan view, respectively, of an embodiment of a sputtering apparatus according to the present invention, in which the reference numeral 1 designates a vacuum chamber and 2 denotes a substrate holder mounted in an upper portion of the vacuum chamber for supporting a substrate 3 to be sputtered. The reference numeral 4 denotes an O-ring for sealing the substrate holder 2 with respect to an opening in the chamber 1 and the numerals 5 and 6 are gas withdrawal conduits which communicate with the vacuum chamber 1 at locations adjacent the substrate holder 2. The reference numeral 7 designates a target disposed on a mounting member 8 in a lower portion of the vacuum chamber 1, 9 is an annular gas distribution conduit, 10 is a gas supply conduit connected to the gas distribution conduit 9, and 11 is a flow control valve for controlling the gas flow rate. The reference numeral 12 denotes an annular gas rebounding or guide plate mounted immediately downstream of gas jet openings 16A, and 13 denotes fins also mounted near the gas jet openings 16A.

More specifically, and as shown in FIG. 1(a), the mounting member 8 has an upper surface 8A which faces the substrate 3 and on which the target 7 is supported, and the target 7 has an upper surface 7A which faces the substrate 3. A cylindrical sleeve 16 encircles and is spaced radially outwardly from the target 7, has its lower end disposed against and its axis generally perpendicular to the surface 8A, and has a plurality of the gas jet openings 16A extending radially therethrough at circumferentially spaced locations. The annular gas distribution conduit 9 snugly encircles the sleeve 16 and communicates with the gas jet openings 16A therethrough. The annular gas rebounding plate 12 has its radially outer edge portion 12A secured to the upper end of the sleeve 16, and is bent to extend downwardly and inwardly so that its radially inner edge portion 12B is approximately parallel to and spaced a small distance above the upper surface 7A of the target 7. The fin 13 is of frustoconical shape and has its lower, smaller diameter end secured to the upper end of the sleeve 16, so that it diverges upwardly and outwardly. The upper edge 13A of the fin 13 is located adjacent the walls of the chamber 1 just below the gas withdrawal conduits 5 and 6.

A conventional source 20 of pressurized gas is connected to the gas supply conduit 10, and the gas withdrawal conduits 5 and 6 are connected to one or more conventional vacuum pumps 21.

With the illustrated arrangement, the gas is guided into the vacuum chamber 1 from the gas conduits 9 and 10 through the gas jet openings 16A. In this case, by appropriately determining the diameter of the gas conduits 9 and 10 and the gas jet openings 16A, as well as by controlling the gas supply pressure, the gas pressure within the vacuum chamber 1 is so arranged as to gradually decrease from the region near the target 7 to the region near the substrate holder 2. That is, the gas to be supplied to the vacuum chamber 1 does not enter the chamber 1 directly, but is guided through the gas jet openings 16A and, in addition, is evenly jetted over the target 7. Therefore, the gas flow rebounding from the upper surface of the target 7 advances toward the substrate 3, thus causing the described variation of the gas pressure.

Further, since the gas withdrawal conduits 5 and 6 communicate with the chamber 1 near the substrate holder 2, the gas pressure around the substrate holder 2 becomes lower. Thus, as described above, the gas pressure gradually decreases from the region near the target 7 toward the substrate holder 2.

More gas withdrawal conduits 5 and 6 may be provided which communicate with the chamber 1 at locations adjacent and above or to the side of the substrate holder 2.

In order to prevent the pressure of the gas jetted from the gas jet openings 16A from varying rapidly around the openings 16A, it is preferable if the gas has previously expanded within the gas supply conduits 9 and 10. In addition, the fins 13 provided near the gas jet openings 16A serve to guide the gas flow in a predetermined direction to thereby allow the gas to smoothly expand.

Further, the speed of the gas flow is decreased by the gas rebounding plate 12 provided at a location downstream of the gas flow with respect to the gas jet openings 16A so that the flux of the sputtered target material toward the substrate during sputtering can be maintained. By arranging the gas rebounding plate 12 so as to guide the gas flow toward the upper surface of the target 7, sputtered atoms which return toward the target 7 can be blown off.

Figure 2:
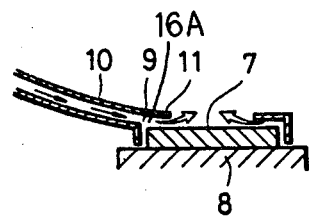
FIG. 2(a) and FIG. 2(b) are a sectional side view and a plan view, respectively, of a portion of another embodiment of the apparatus of FIG. 1(a)
Figure 3A:
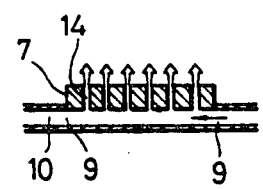
FIG. 3(a) and FIG. 3(b) are a sectional side view and a plan view, respectively, of a portion of a further embodiment of the apparatus of FIG. 1(a).
Figure 2:
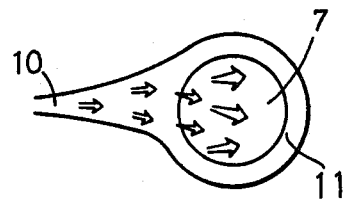
Figure 3:
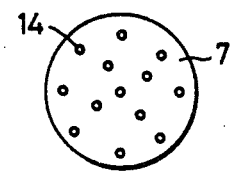

FIGS. 2(a) and 2(b) and FIGS. 3(a) and 3(b) illustrate further embodiments according to the present invention. FIGS. 2(a) and 2(b) illustrate a structure having a gas guide portion 11 which extends inwardly from the gas jet opening 16A to allow the gas to be jetted directly to the upper surface of the target 7. FIGS. 3(a) and 3(b) illustrate a structure in which the target 7 has a plurality of holes 14 therethrough which communicate with the gas distribution conduit 9 for allowing the gas to be jetted directly to the upper surface of the target 7 by flowing therethrough. Similar gas pressures can be obtained near the target in both structures.

As is apparent from the description, the present invention ensures that the gas pressure within the vacuum chamber gradually decreases from the region near the target to the region near the substrate holder, the gas pressure being relatively high near the target and relatively low near the substrate holder, thus allowing the apparatus to realize all of the merits which have only been selectively realized in conventional apparatuses.

That is, it is possible with the inventive apparatus to simultaneously realize all of the desired merits, namely, reactive sputtering, easy formation of a layer having good crystallizability, and a decrease of resputtering, thus providing an excellent layer forming efficiency. Further, since the gas pressure can be kept high, it is possible to realize all of the merits of the sputtering process, and thus to perform highly effective sputtering.

We claim:

1. A sputtering apparatus, comprising a vacuum chamber, substrate holding means supported within said vacuum chamber for holding a substrate, target supporting means supported within said vacuum chamber for supporting a target in opposition to said substrate, a plurality of gas withdrawal conduits communicating with said vacuum chamber at locations adjacent said substrate holding means, gas supply means for supplying a gas to said vacuum chamber in a manner so that the gas pressure gradually decreases from the region of said target to the region of said substrate, said gas supply means including gas jet opening means located near a surface of said target, means defining a fin near said gas jet opening means for guiding the gas flow as it leaves said target, and gas guide means in the region of said gas jet opening means for jetting the gas entering said vacuum chamber through said gas jet opening means directly toward said surface of said target.

2. A sputtering apparatus, comprising a vacuum chamber, substrate holding means supported within said vacuum chamber for holding a substrate, target supporting means supported within said vacuum chamber for supporting a target in opposition to said substrate, a plurality of gas withdrawal conduits communicating with said vacuum chamber at locations adjacent said substrate holding means, gas supply means for supplying a gas to said vacuum chamber in a manner so that the gas pressure gradually decreases from the region of said target to the region of said substrate, said gas supply means including a gas supply conduit and a plurality of openings through said target which communicate with said gas supply conduit.

3. A sputtering apparatus, comprising a vacuum chamber; substrate holding means supported within said vacuum chamber for holding a substrate; target supporting means supported within said vacuum chamber at a location spaced from said substrate holding means for supporting a target so that a surface thereof faces said substrate holding means, said target supporting means including a mounting member having a surface which faces said substrate holding means and on which said target is supported; a plurality of gas withdrawal conduits communicating with said vacuum chamber at locations adjacent said substrate holding means; and gas supply means for supplying a gas to said vacuum chamber in the region of said target, said gas supply means including a cylindrical sleeve which encircles said target, which sleeve is supported on said surface of said mounting member with its axis approximately perpendicular thereto, and which sleeve has a plurality of circumferentially spaced gas jet openings extending radially therethrough, an annular conduit which is supplied with said gas, which conduit snugly encircles said sleeve and which conduit communicates with said gas jet openings in said sleeve, an annular gas guide plate having its radially outer edge portion secured to an end of said sleeve nearest said substrate holding means and having its radially inner edge portion spaced slightly from said surface on said target, and a fin of frustoconical shape which has its smaller diameter end secured to said end of said sleeve and which extends away from said sleeve and toward said substrate holding means.

* * * * *